United States Patent
Matthews (10) Patent No.: US 11,167,701 B2
(45) Date of Patent: Nov. 9, 2021

(54) MOUNTING BRACKET ASSEMBLY FOR IN-MODULE MEDIA ASSEMBLY

(71) Applicant: NISSAN NORTH AMERICA, INC., Franklin, TN (US)

(72) Inventor: Christopher Matthews, Farmington Hills, MI (US)

(73) Assignee: NISSAN NORTH AMERICA, INC., Franklin, TN (US)

(*) Notice: Subject to any disclaimer, the term of this patent is extended or adjusted under 35 U.S.C. 154(b) by 25 days.

(21) Appl. No.: 16/428,494

(22) Filed: May 31, 2019

(65) Prior Publication Data

US 2020/0377035 A1    Dec. 3, 2020

(51) Int. Cl.
  *B60R 11/02*      (2006.01)
  *H05K 5/00*       (2006.01)
  *H05K 5/02*       (2006.01)
  *B60R 11/00*      (2006.01)

(52) U.S. Cl.
  CPC ........ *B60R 11/0235* (2013.01); *H05K 5/0017* (2013.01); *H05K 5/0204* (2013.01); *B60R 2011/0005* (2013.01); *B60R 2011/0047* (2013.01)

(58) Field of Classification Search
  None
  See application file for complete search history.

(56) References Cited

U.S. PATENT DOCUMENTS

| | | | |
|---|---|---|---|
| 5,104,071 A | 4/1992 | Kowalski | |
| 2003/0142063 A1* | 7/2003 | Wang | B60R 11/0235 345/156 |
| 2006/0108820 A1* | 5/2006 | Vican | B60R 11/0235 296/37.12 |
| 2006/0249632 A1* | 11/2006 | McKelvey | B60R 11/02 248/27.1 |
| 2009/0154134 A1 | 6/2009 | Hassler | |
| 2009/0268411 A1 | 10/2009 | Baker | |
| 2011/0292769 A1* | 12/2011 | Snider | H05K 7/14 368/47 |
| 2013/0058014 A1* | 3/2013 | King, II | B60R 11/0258 361/679.01 |
| 2016/0345045 A1* | 11/2016 | Liu | H04N 21/41422 |

* cited by examiner

*Primary Examiner* — James Wu
*Assistant Examiner* — Christopher L Augustin
(74) *Attorney, Agent, or Firm* — Global IP Counselors, LLP (57) ABSTRACT

An in-module media assembly includes a display screen, a mounting bracket assembly and an electronic control module. The display has an interior-facing side and a non-interior facing side. The mounting bracket assembly is mounted to the non-interior facing side of the display screen. The mounting bracket assembly includes a mounting bracket and a shelf. The mounting bracket has a first longitudinally extending support member and a second longitudinally extending support member. The shelf is connected to the first and second longitudinally extending support members. The shelf includes first and second engagement members. The first engagement member engages the first longitudinally extending support member and the second engagement member engages the second longitudinally extending support member. The first and second engagement members prevent forward movement of the shelf with respect to the mounting bracket. The electronic control module is mounted to the shelf.

20 Claims, 8 Drawing Sheets

MOUNTING BRACKET ASSEMBLY FOR IN-MODULE MEDIA ASSEMBLY

BACKGROUND

Field of the Invention

The present invention generally relates to a mounting bracket assembly for an in-module media assembly for a vehicle. More specifically, the present invention relates to a mounting bracket assembly configured to facilitate installation of an electronic control module.

Background Information

Vehicles typically include an in-module media assembly to provide in-vehicle information and entertainment for vehicle occupants in the form of video and audio. Most vehicles include a cockpit module having a pre-formed opening configured to receive the in-module media assembly. Installation of the in-module media assembly can be time consuming and difficult.

SUMMARY

An object of the disclosure is to provide a mounting bracket assembly for an in-module media assembly for a vehicle to facilitate installation.

In view of the state of the known technology, one aspect of the present disclosure is to provide an in-module media assembly including a display screen, a mounting bracket assembly and an electronic control module. The display has an interior-facing side and a non-interior facing side. The mounting bracket assembly is mounted to the non-interior facing side of the display screen. The mounting bracket assembly includes a mounting bracket and a shelf. The mounting bracket has a first longitudinally extending support member and a second longitudinally extending support member. The shelf is connected to the first and second longitudinally extending support members. The shelf includes first and second engagement members. The first engagement member engages the first longitudinally extending support member and the second engagement member engages the second longitudinally extending support member. The first and second engagement members prevent forward movement of the shelf with respect to the mounting bracket. The electronic control module is mounted to the shelf.

Another aspect of the present invention includes a mounting bracket assembly including a mounting bracket and a shelf. The mounting bracket is configured to be mounted to a display screen of a vehicle. The mounting bracket includes a first longitudinally extending support member and a second longitudinally extending support member. The shelf is connected to the first and second longitudinally extending support members. The shelf includes first and second engagement members. The first engagement member engages the first longitudinally extending support member and the second engagement member engages the second longitudinally extending support member. The first and second engagement members prevent forward movement of the shelf with respect to the mounting bracket.

Also other objects, features, aspects and advantages of the disclosed mounting bracket assembly for an in-module media assembly will become apparent to those skilled in the art from the following detailed description, which, taken in conjunction with the annexed drawings, discloses exemplary embodiments of the mounting bracket assembly for an in-module media assembly.

BRIEF DESCRIPTION OF THE DRAWINGS

Referring now to the attached drawings which form a part of this original disclosure.

DETAILED DESCRIPTION OF EXEMPLARY EMBODIMENTS

Selected embodiments will now be explained with reference to the drawings. It will be apparent to those skilled in the art from this disclosure that the following descriptions of the exemplary embodiments are provided for illustration only and not for the purpose of limiting the invention as defined by the appended claims and their equivalents.

Figure 1:
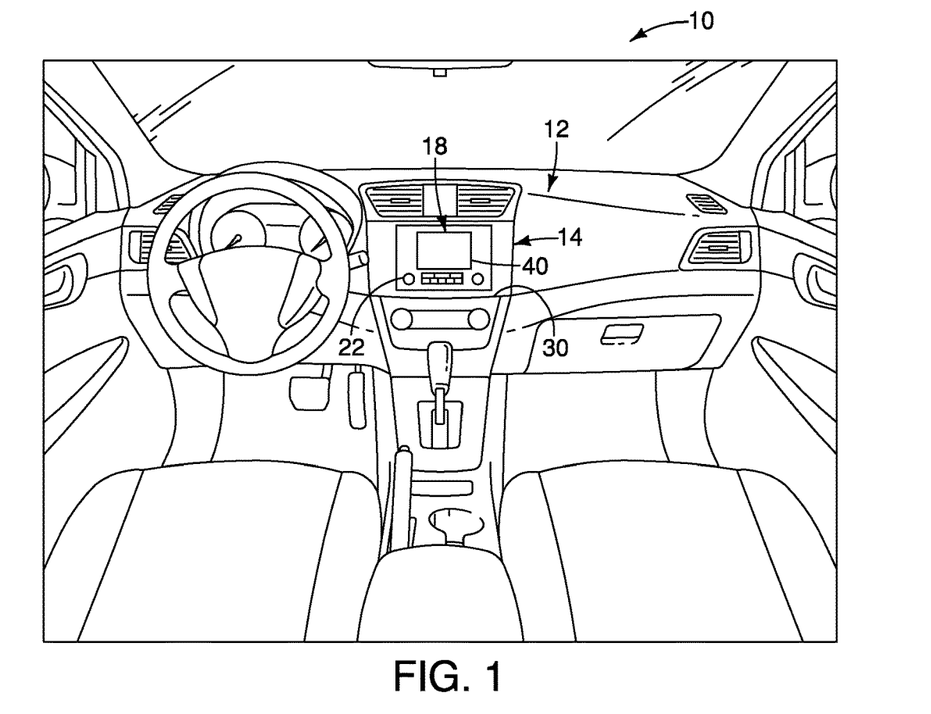
FIG. 1 is a perspective view of a vehicle interior showing a cockpit module having an in-module media assembly in accordance with an exemplary embodiment of the present invention.

Referring initially to FIG. 1, an interior of a vehicle 10 is illustrated in accordance with a first illustrated embodiment. The vehicle 10 includes a cockpit module 12 and an in-module media assembly 14 configured to be supported in a cavity (not shown) located behind the cockpit module 12. The cockpit module 12 is a control panel that is located forward of a vehicle driver. The cockpit module 12 is configured to display instrumentation and controls for the vehicle operation, such as, but not limited to, a speedometer, tachometer, odometer, fuel gauge, turn indicators, gearshift position indicator, heating and ventilation systems, lighting controls, safety systems, entertainment equipment and navigation systems). The in-module media assembly 14 is configured to be installed in the vehicle cockpit module 12.

The in-module media assembly 14 is considered part of the entertainment equipment for the vehicle 10. In other words, the in-module media assembly 14 includes equipment installed to provide in-vehicle entertainment and information for the vehicle occupant(s). The in-module media assembly 14 preferably includes audio equipment, such as a radio, cassette or CD players. The in-module media assembly 14 can additionally include video players and equipment enabling universal serial bus (USB) and Bluetooth connectivity, in-vehicle Internet and WiFi. The in-module media assembly 14 further includes an electronic control module 16 (FIGS. 2-9), such as a telematic control module to control tracking of the vehicle 10. The in-module media assembly 14 includes a display screen 18 and a media chassis 20. The display screen 18 displays information to a vehicle occupant. The media chassis 20 is configured to support and/or protect the media/audio equipment installed in the cockpit module 12. Optionally, the in-module media assembly 14 can further include equipment for telecommunication, in-vehicle security, handsfree calling, navigation and remote diagnostic systems. The in-module media assembly 14 can include a control interface 22 for occupant operation, such as knobs and dials. The in-module media assembly 14 can alternatively be controlled by steering wheel audio controls and handsfree voice control.

The in-module media assembly 14 further includes a mounting bracket assembly 24 that is connected to the display screen 18, as shown in FIGS. 3, 4 and 6-9. The mounting bracket assembly 24 includes a mounting bracket 26 and a shelf 28 connected to the mounting bracket 26. The mounting bracket 26 is configured to be connected to the display screen 18. The shelf 28 is configured to receive the electronic control module 16. The shelf 28 is configured to be connected to the mounting bracket 26.

Figure 3:
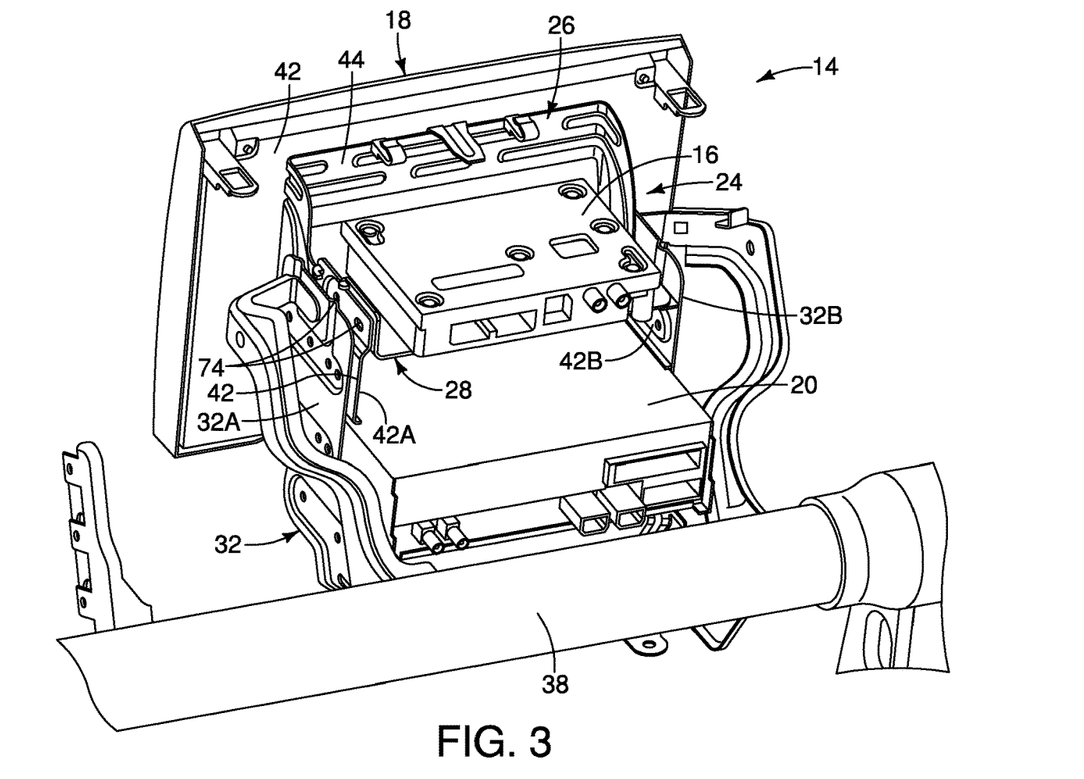
FIG. 3 is an upper rear perspective view of the in-module media assembly of FIG. 2.
Figure 7:
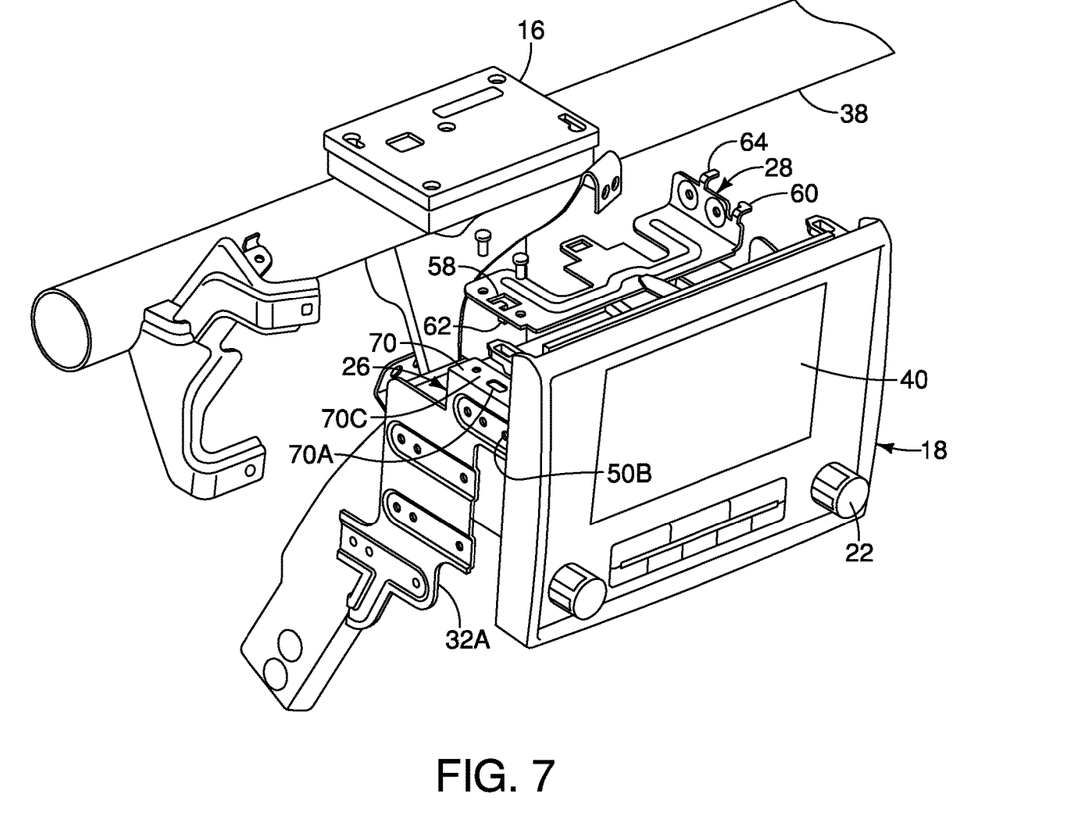
FIG. 7 is a front exploded perspective view of the in-module media assembly of FIG. 2.
Figure 8:
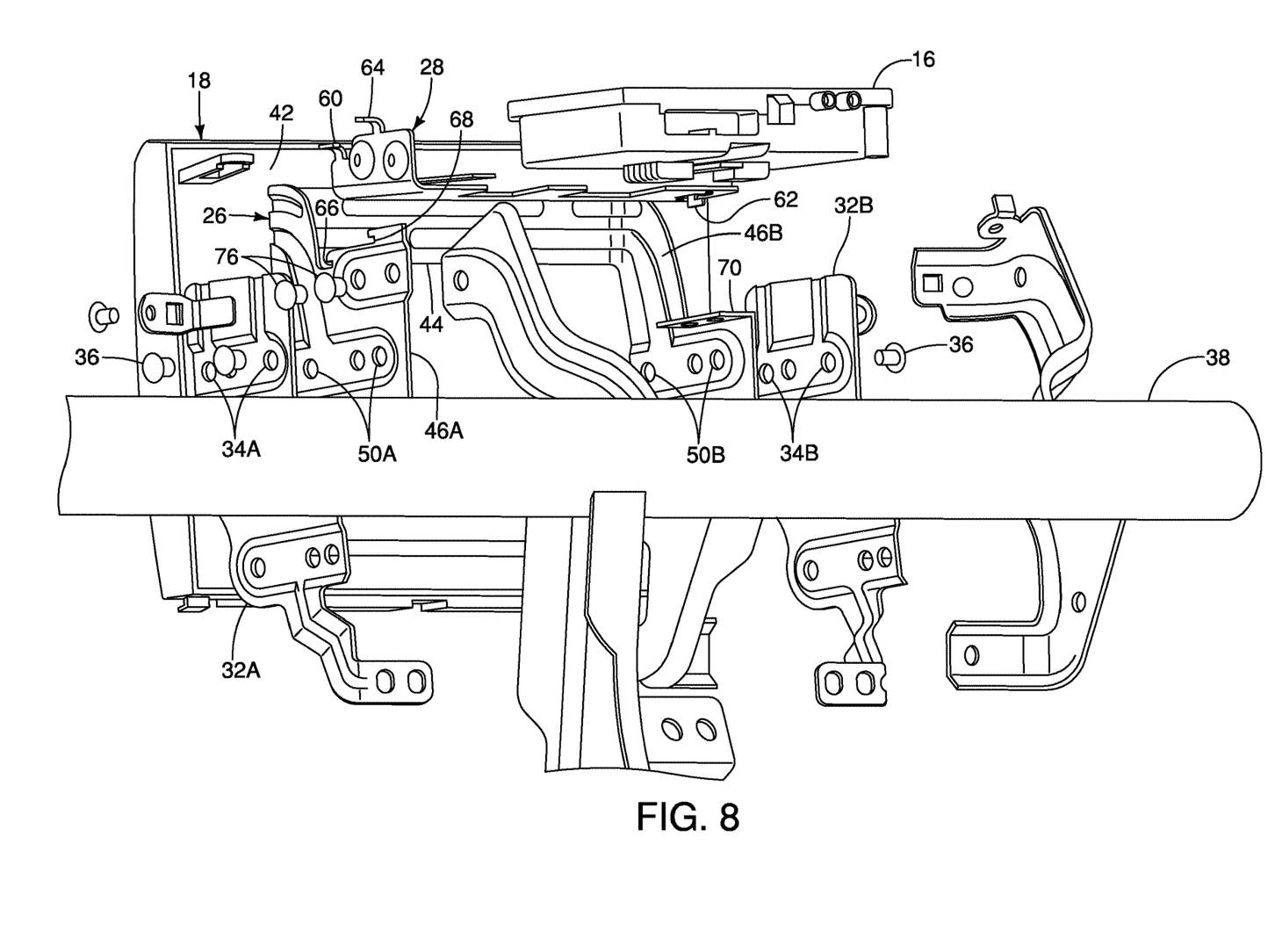
FIG. 8 is a rear exploded perspective view of the in-module media assembly of FIG. 2.

The mounting bracket 26 is fixedly attached to at least one of the display screen 18 and the media chassis 20. As shown in FIGS. 3, 7 and 8, the mounting bracket 26 is fixedly attached to the display screen 18. The mounting bracket 26 can further absorb an impact received by the in-module media assembly 14 of the vehicle 10.

Conventionally, when a vehicle experiences an impact with an external object, an interior object of the vehicle, such as a vehicle occupant, can contact the conventional media assembly. A conventional display screen of the conventional media assembly is likely to pivot or tilt in a vehicle forward direction and into the interior of the vehicle cockpit module. As a result, the interior object can move into the cavity behind the cockpit module 10 where various electronic units are housed, such as the media chassis of the conventional media assembly. The mounting bracket 26 of the exemplary embodiment of the present invention is configured to absorb the impact that is received by the in-module media assembly 14. In particular, the mounting bracket 26 is configured to absorb some of the impact received from the interior object so that the display screen 18 of the in-module media assembly 14 does not pivot or tilt as much as a conventional display screen, thereby preventing the interior object from making contact with the electronic units behind the vehicle cockpit module 12.

In the illustrated embodiment, the cockpit module 12 includes a pre-formed opening 30 sized and dimensioned to receive the in-module media assembly 14 into the cavity. As shown in FIGS. 2, 3, 5, 7 and 8, the in-module media assembly 14 is supported in the cockpit module 12 by a media chassis support structure 32. Thus, the media chassis support structure 32 supports the in-module media assembly 14 within the vehicle 10. The media chassis support structure 32 is adapted to mount the media chassis 20 in the vehicle 10. Alternatively, the media chassis support structure 32 can be embedded in the cockpit module 12, the center console or the roof of the vehicle 10 in any suitable manner. As shown in FIG. 1, the media chassis support structure 32 is embedded inside the pre-formed opening 30 of the cockpit module 12.

As shown in FIGS. 2, 3, 5, 7 and 8, the media chassis support structure 32 includes a pair of rigid members supporting the media chassis 20 to the cockpit module 12. In particular, the media chassis support structure 32 includes a first rack mount 32A and a second rack mount 32B that are attached to opposite lateral sides of the in-module media assembly 14. In particular, the first and second rack mounts 32A and 32B are fixedly installed to the mounting bracket 26. Each of the first and second rack mounts 32A and 32B includes at least one fastener hole 34 configured to receive a connecting structure, such as, but not limited to, conventional screws, self-tapping screws or bolts, to attach the in-module media assembly 14 to the mounting bracket 26. As shown in FIGS. 7 and 8, each of the first and second rack mounts 32A and 32B has two fastener holes 34A and 34B, respectively, that receives fasteners 36 to attach the media chassis support structure 32 to the mounting bracket 26. The media chassis support structure 32 can have any suitable number and configuration of fastener holes 34.

The media chassis support structure 32 can include any structure or set of structures that allow the media chassis 20 to be mounted and supported in the vehicle 10. Thus, it will be apparent to those skilled in the vehicle field from this disclosure that the media chassis support structure 32 can include additional support members or alternatively be an integrated one-piece member.

As shown in FIGS. 2, 3, 7 and 8, the media chassis support structure 32 is fixedly connected to a cross-car beam 38 of the vehicle 10. The cross-car beam 38 is a structural member that is located underneath the cockpit module 12 inside the cavity. The cross-car beam 38 extends within the cavity such that the vehicle cross-car beam 38 positions and secures the in-module media assembly 14 in the cavity. The cross-car beam 38 is secured a vehicle body structure (not shown) by welds, bolts or other suitable securing members. While the cross-car beam 38 is shown forward of the cockpit module 12, it will be apparent to those skilled in the vehicle field from this disclosure that the in-module media assembly 12 can alternatively be secured to a cross-car beam that is situated adjacent to the cockpit module 12.

The display screen 18 is sized and dimensioned to correspond to portions of the pre-formed opening 30 of the cockpit module 10. The display screen 18 can be any suitable size. The display screen 18 has an interior-facing side 40 and a non-interior facing side 42, as shown in FIGS. 1 and 3. The interior-facing side 40 of the display screen 18 is positioned facing the interior of the vehicle 10 when the in-module media assembly 14 is installed in the vehicle 10. The interior-facing side 40 includes a video and audio display and a user interface for the occupant to operate the in-module media assembly 14. The non-interior facing side 42 faces the cavity when the in-module media assembly 14 is installed in the vehicle 10. In other words, the interior-facing side 40 of the display screen 18 faces toward the vehicle cabin as shown in FIG. 1, and the non-interior facing side 42 faces away from the vehicle cabin.

Figure 2:
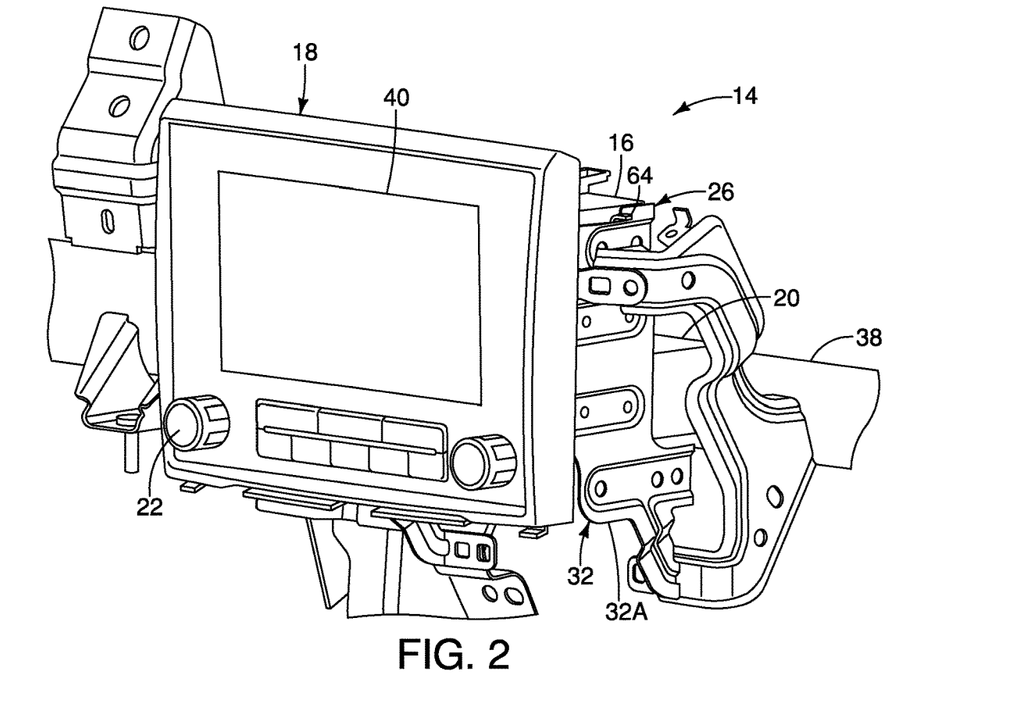
FIG. 2 is a front perspective view of the in-module media assembly.
Figure 5:
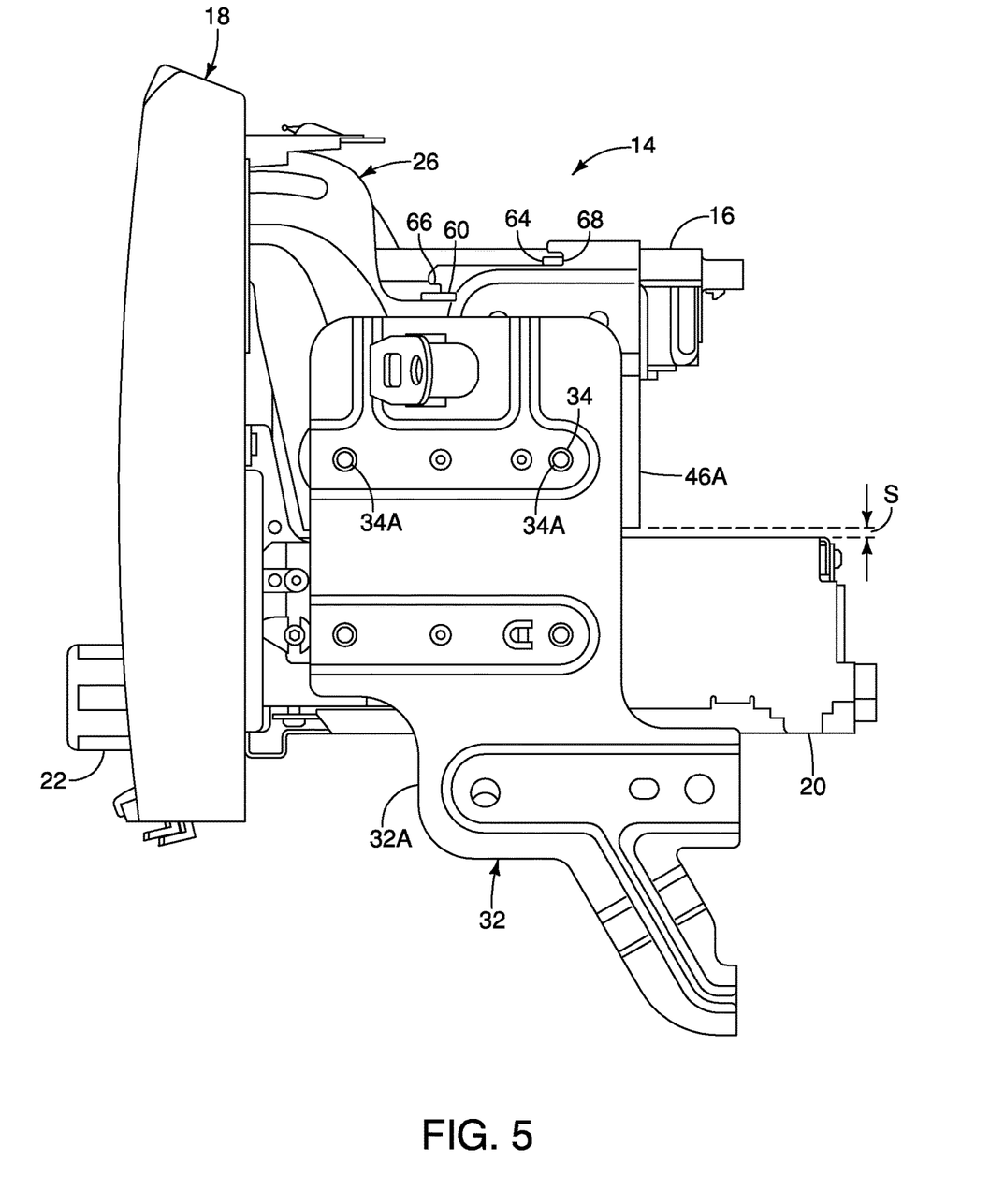
FIG. 5 is a side elevational view of the in-module media assembly of FIG. 2.
Figure 6:
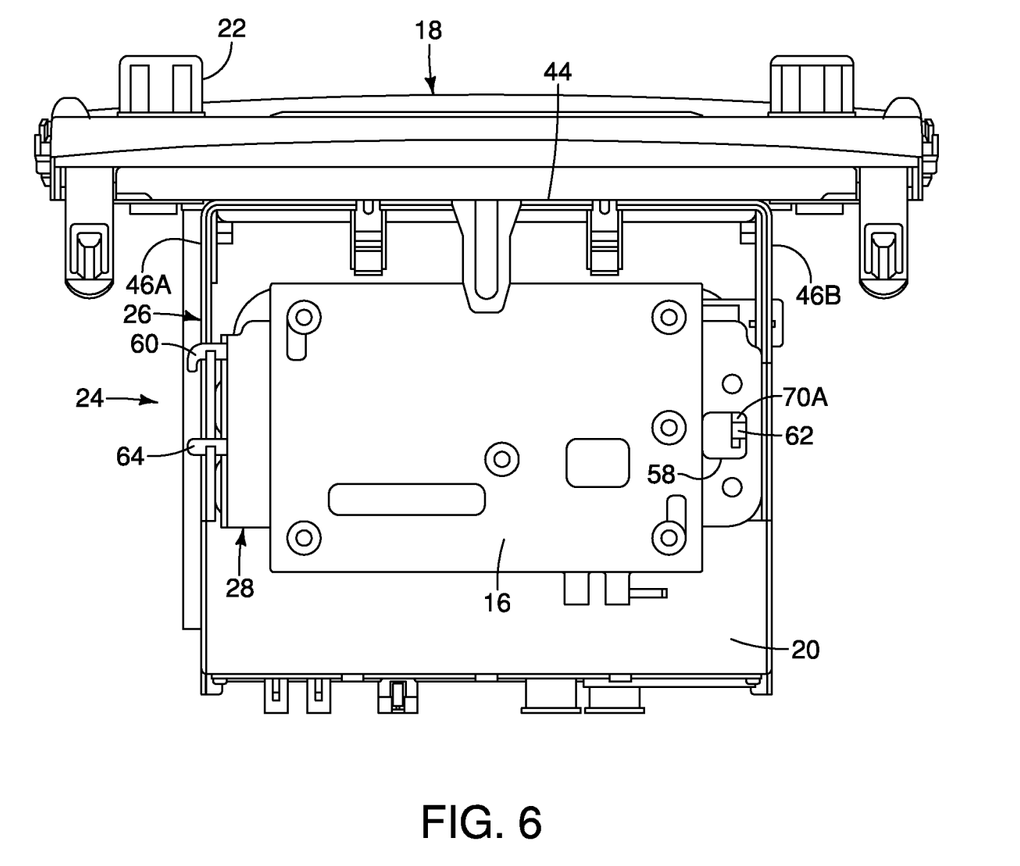
FIG. 6 is top plan view of the in-module media assembly of FIG. 2.

As shown in FIGS. 2, 3 and 5, the media chassis 20 is mounted to a lower half of the display screen 18 and extends from the non-interior facing side 42 of the display screen 18. The media chassis 20 is configured to house one or more electrical components (not shown), including, for example, but not limited to printed circuit boards, integrated circuits, AM, FM, and satellite radio receivers, CD players, multi-CD changers, digital audio players, and cassette tape decks and/or a navigation system. Preferably, the media chassis 20 further includes components that enable the vehicle occupant to access or manipulate the electrical components housed within the media chassis 20. For example, the user interface of the display screen 18 electrically communicates with one or more electrical components housed within the media chassis 20.

The media chassis 20 is a single or multi-piece rigid member. Preferably, the media chassis 20 is made of a metallic material, such as acrylonitrile butadiene styrene (ABS) with steel fiber. In other cases, polycarbonate acrylonitrile butadiene styrene (PCABS) with carbon fiber may be used to construct the media chassis 20. The media chassis 20 can further include a conductive polymer to construct the media chassis 20 for weight reduction. The media chassis 20 can also be made of any material that provides electromagnetic radiation shielding and shock absorbance.

As shown in FIGS. 2, 3, 5 and 6, the electronic control module 16 is disposed above the media chassis 20 proximate an upper half of the display screen 18. The electronic control module 16 is configured to house one or more electrical components (not shown), including, for example, but not limited to printed circuit boards, integrated circuits, AM, FM, and satellite radio receivers, CD players, multi-CD changers, digital audio players, and cassette tape decks and/or a navigation system. Preferably, the electronic control module 16 is a telematics control module to control tracking of the vehicle 10. Preferably, the electronic control module 16 further includes components that enable the vehicle occupant to access or manipulate the electrical components housed within the electronic control module 16. For example, the user interface of the display screen 18 electrically communicates with one or more electrical components housed within the electronic control module 16.

The electronic control module 16 is a single or multi-piece rigid member. Preferably, the electronic control module 16 is made of a metallic material, such as acrylonitrile butadiene styrene (ABS) with steel fiber. In other cases, polycarbonate acrylonitrile butadiene styrene (PCABS) with carbon fiber may be used to construct the electronic control module 16. The electronic control module 16 can further include a conductive polymer to construct the electronic control module 16 for weight reduction. The electronic control module 16 can also be made of any material that provides electromagnetic radiation shielding and shock absorbance.

The mounting bracket 26 is a rigid metallic member that is cantilevered with respect to the display screen 18. Preferably, the mounting bracket 26 is made of steel. More preferably, the mounting bracket 26 is made of ABS with steel fiber for rigidity, durability and weight reduction.

As shown in FIGS. 3-5, 8 and 9, the mounting bracket 26 has a display screen attachment part 44 and a contact part 46. The display screen attachment part 44 is attached to an upper half of the non-interior facing side 42 of the display screen 18 and extends therefrom. The display screen attachment part 44 extends along a lateral length of the non-interior facing side 42 of the display screen 18. The display screen attachment part 44 is fixedly connected to the non-interior-facing side 42 of the display screen 18. The display screen attachment part 44 can be fixedly attached to the display screen 18 in any suitable manner, such as, but not limited to, connecting bolts, screws or welding.

The contact part 46 of the mounting bracket 26 is configured to contact the media chassis 20 upon the in-module media assembly 14 experiencing a prescribed impact from the interior object. In particular, the contact part 46 is configured to contact the media chassis 20 upon relative movement of the upper half of the display screen 18 towards the media chassis 20. Alternatively, the contact part 46 can displace in the forward direction relative to the media chassis 20. Thus, the contact part 46 is configured to at least contact the media chassis 20 or to displace relative to the media chassis 20 upon relative movement of the upper half of the display screen 18 towards the media chassis 20.

Figure 4:
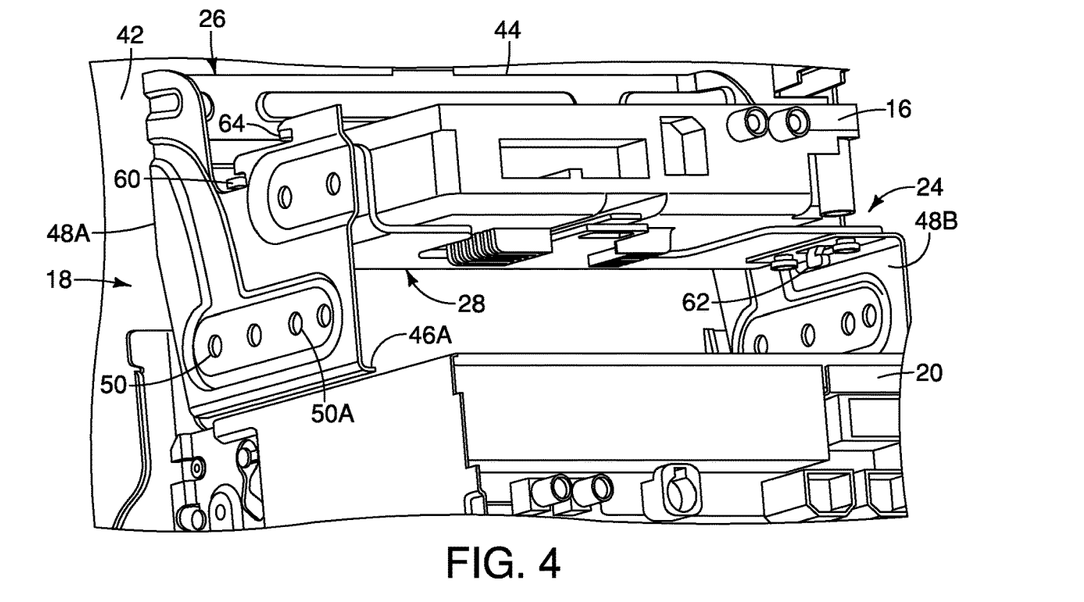
FIG. 4 is a lower rear perspective view of the in-module media assembly of FIG. 2.

As shown FIGS. 3-5, the contact part 46 is spaced from the media chassis 20 when the display screen 18 has not moved relative to the media chassis 20. In other words, the media chassis 20 and the contact part 46 are separated by a space S, as shown in FIG. 5. Upon relative movement between the display screen 18 and the media chassis 20, the contact part 46 closes the space S to contact the media chassis 20. The space S can vary depending on the dimensions of the mounting bracket 26, the media chassis 20, and the display screen 18.

Figure 9:
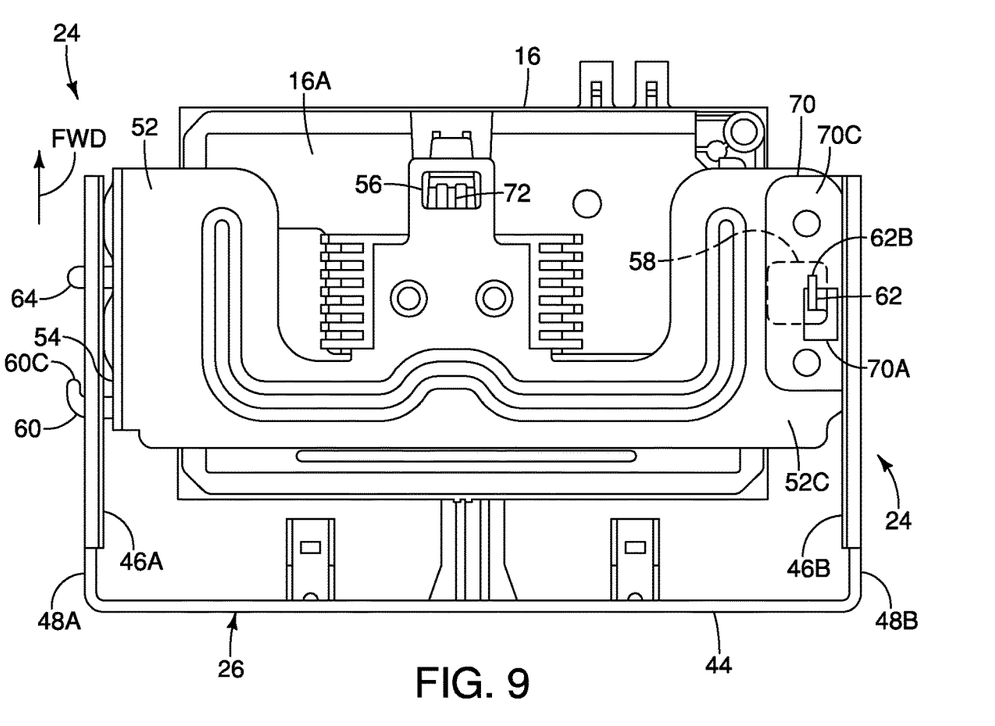
FIG. 9 is lower plan view of a mounting bracket assembly of the in-module media assembly of FIG. 2 receiving an electronic control module.

A longitudinally extending support member 48 extends from the display screen attachment part 44, as shown in FIGS. 3 and 9. The longitudinally extending support member 48 includes a first longitudinally extending support member 48A and a second longitudinally extending support member 48B. The first and second longitudinally extending support members 48A and 48B extend cantilevered with respect to the display screen 18 from the display screen attachment part 44. The first and second longitudinally extending support members 48A and 48B extend longitudinally from opposite lateral ends of the display screen attachment part 44. The first and second longitudinally extending support members 48A and 48B are substantially parallel. Preferably, the contact part 46, the display screen attachment part 44 and the longitudinally extending support member 48 of the mounting bracket 26 are integrally formed as a one-piece member. In particular, the contact part 46, the display screen attachment part 44 and the longitudinally extending support member 48 are formed as a one-piece molded steel member.

The contact part 46 includes a first contact section 46A and a second contact section 46B. As shown, the first and second contact sections 46A and 46B extend from the first and second longitudinally extending support members 48A and 48B towards one another. The first and second contact sections 42A and 42B extend inwardly towards one another from lower edges of the first and second longitudinally extending support members 48A and 48B, as shown in FIG. 3. The first and second contact sections 42A and 42B can have any suitable width. Upon relative movement of the upper half of the display screen 18 towards the media chassis 20, the first and second contact sections 46A and 46B close the space S to contact the media chassis 20. The mounting bracket 26 can deform upon contact with the media chassis 20 and/or displace forward, depending on the force received. The display screen 18 is configured to deflect towards the media chassis 20 upon receiving an impact of approximately seventy Newtons or greater. However, it will be apparent to those skilled in the vehicle field from this disclosure that the display screen 18 can deflect towards the media chassis 20 upon receiving a variable force depending on the weight and dimensions of all of the components of the in-module media assembly 14.

As shown in FIGS. 4, 7 and 8, the longitudinally extending support member 48 includes at least one fastener hole 50 corresponding to the at least one fastener hole 34 in the media chassis support structure 32 to receive the fastener 36. The first and second longitudinally extending support members 48A and 48B of the mounting bracket 26 each includes at least one fastener hole 50A and 50B, respectively, configured to receive the fasteners 36. The fastener holes 34A and 34B of the first and second rack mounts 32A and 32B of the media chassis support structure 32 are aligned with the fastener holes 50A and 50B of the first and second longitudinally extending support members 48A and 48B, respectively. Any suitable fastener can be used. The fasteners 36 can be shear bolts that are displaced from the receiving holes of the media chassis support structure 32 upon relative movement of the display screen 18 towards the media chassis 20.

Figure 10:
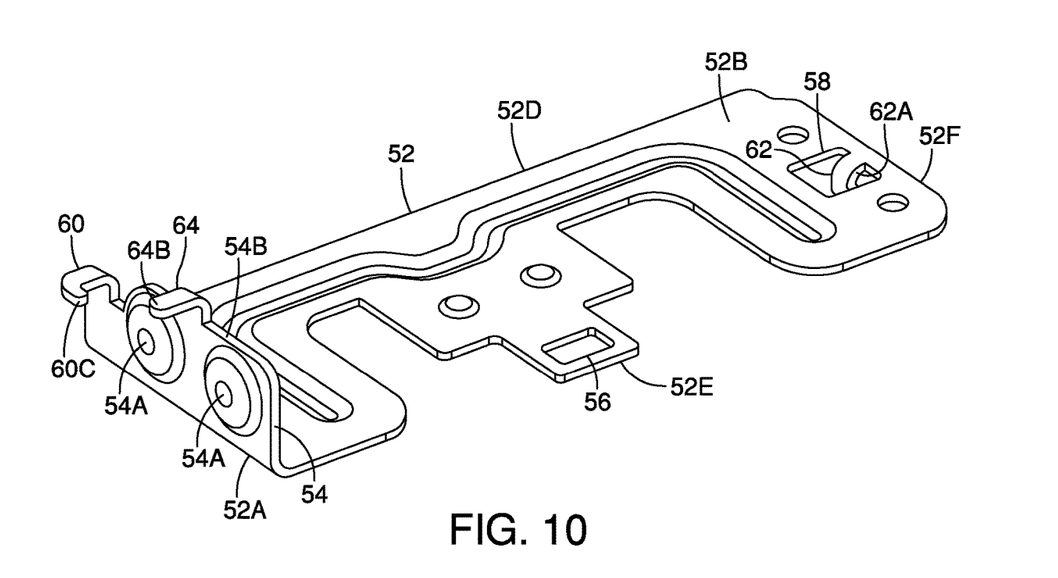
FIG. 10 is a perspective view of a shelf of the mounting bracket assembly of FIG. 9.

The shelf 28 includes a base member 52 and a wall member 54 extending outwardly from a first lateral edge 52A of the base member 52, as shown in FIG. 9-13. The shelf 28 is configured to be mounted to the mounting bracket 26, as shown in FIG. 9 to form the mounting bracket assembly 24. The electronic control module 16 is configured to be mounted to the shelf 28, as shown in FIG. 9. The shelf 28 is preferably a rigid metallic member. Preferably, the shelf 28 is made of steel. More preferably, the shelf 28 is made of ABS with steel fiber for rigidity, durability and weight reduction The base member 52 includes a first opening 56 and a second opening 58 extending from an upper surface 52B to a lower surface 52C of the base member 52, as shown in FIGS. 9 and 10. The first and second openings 56 and 58 are disposed forward of a rear edge 52D of the base member 52. The first opening 56 is disposed proximate a forward edge 52E of the base member 52. The first opening 56 is substantially centered in a lateral direction of the base member 52. The second opening 58 is disposed proximate a second lateral edge 52F of the base member 52 disposed opposite the first lateral edge 52A.

The wall member 54 is a substantially planar member, as shown in FIG. 9. The wall member 54 extends upwardly from the first lateral edge 52A of the base member 52. Preferably, the wall member 54 extends substantially perpendicularly to the base member 52. A plurality of fastener holes 54A are disposed in the wall member 52 between the first lateral edge 52A of the base member and an upper edge 54B of the wall member 54.

Figure 11:
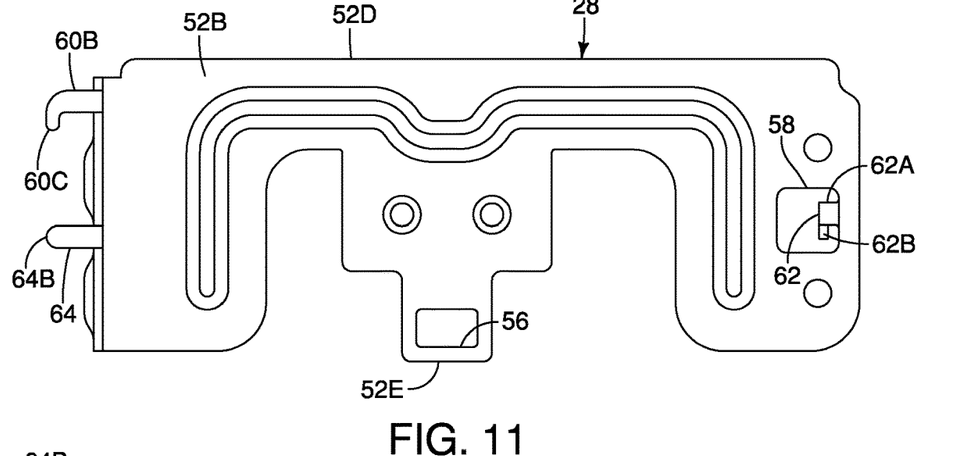
FIG. 11 is a top plan view of the shelf of FIG. 10.
Figure 12:
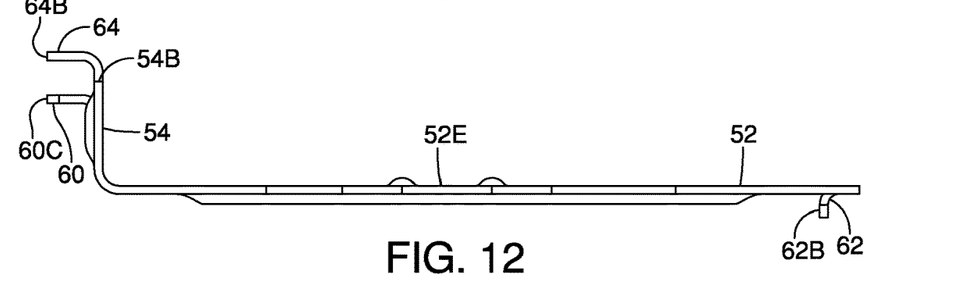
FIG. 12 is a front elevational view of the shelf of FIG. 10.
Figure 13:
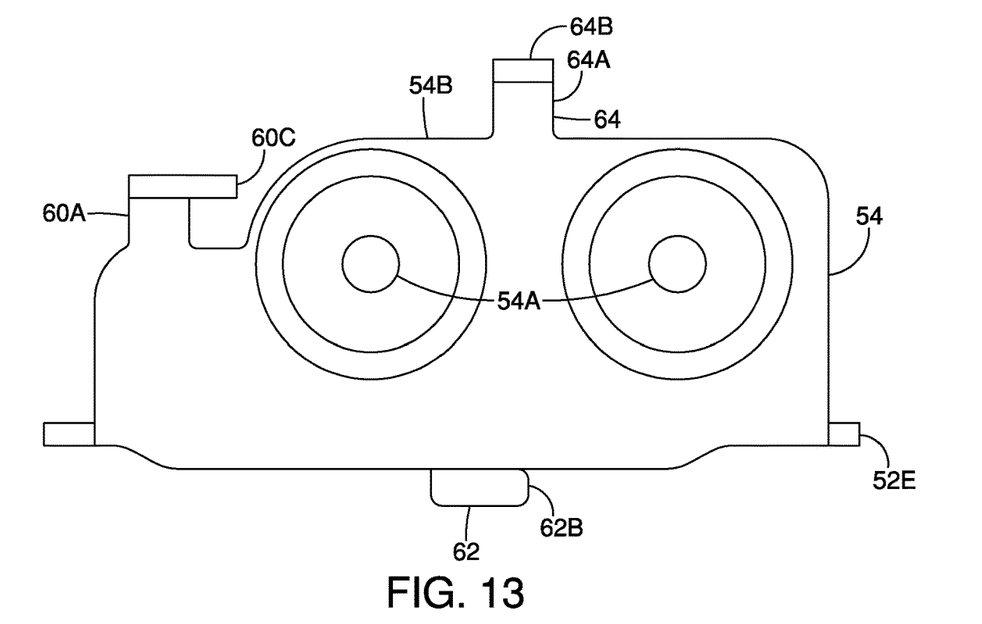
FIG. 13 is a side elevational view of the shelf of FIG. 10.

The shelf 28 includes a first engagement member 60 configured to engage the mounting bracket 26, as shown in FIGS. 9-13. The first engagement member 60 has a first portion 60A extending upwardly from the upper edge 54B of the wall member 54, as shown in FIG. 13. A second portion 60B of the first engagement member 60 extends outwardly in a lateral direction from the first portion 60A of the first engagement member 60, as shown in FIG. 11. The second portion 60B extends substantially perpendicularly to the wall member 54. An end portion 60C of the first engagement member 60 extends forwardly from the second portion 60B of the first engagement member 60. The end portion 60C of the first engagement member 60 extends substantially parallel to the wall member 54.

The shelf 28 includes a second engagement member 62 configured to engage the mounting bracket 26, as shown in FIGS. 9-13. The second engagement member 62 has a first portion 62A extending outwardly and downwardly from the base member 52 of the shelf 28, as shown in FIG. 11. The first portion 62A of the second engagement member 62 extends within the second opening 58 in the base member 52 when viewed from above, as shown in FIG. 11. An end portion 62B of the second engagement member 62 extends forwardly from the second end portion 62B. In other words, the second portion 62B extends in a direction away from the display screen 18 and toward the forward edge 52E of the base member 52. The end portion 62B of the second engagement member 62 extends in a direction substantially parallel to the wall member 54. As shown in FIGS. 10, 12 and 13, the end portion 62B of the second engagement member 62 is disposed beneath the base member 52 of the shelf 28.

The shelf 28 includes a third engagement member 64 configured to engage the mounting bracket 26. The third engagement member 64 has a first portion 64A extending upwardly from the upper edge 54B of the wall member 54, as shown in FIG. 13. An end portion 64B of the third engagement member 64 extends outwardly in a lateral direction from the first portion 64A of the third engagement member 64. The end portion 64B of the third engagement member 64 extends substantially perpendicular to the wall portion 54. As shown in FIGS. 10, 12 and 13, the third engagement member 64 is disposed higher than the first engagement member 60.

The first longitudinally extending support member 46A includes a first recess 66 and a second recess 68 disposed therein, as shown in FIGS. 5 and 8. The first recess 66 receives the first engagement member 60. The second recess 68 receives the third engagement member 64. The first and second recesses 66 and 68 extend in the longitudinal direction. The second portion 60B of the first engagement member 60 contacts an end of the first recess 66 to prevent forward movement of the shelf 28 with respect to the mounting bracket 26. The end portion 64B of the third engagement member 64 contacts an end of the second recess 68 to prevent forward movement of the shelf 28 with respect to the mounting bracket 26.

The second longitudinally extending support member 48B includes a base portion 70 extending inwardly therefrom, as shown in FIGS. 4, 7, 8 and 9. The base portion 70 extends toward the first longitudinally extending support member 48A. As shown in FIG. 9, a longitudinal length of the base portion 70 is less than that of the second longitudinally extending support member 48B. An opening 70A disposed in the base portion 70 extends from an upper surface 70B to a lower surface 70C. The opening 70A in the base portion 70 of the second longitudinally extending support member 48B receives the second engagement member 62. As shown in FIGS. 9 and 11, the first portion 62A of the second engagement member 62 engages a forward edge defining the opening 70A to prevent forward movement of the shelf 28 with respect to the mounting bracket 26.

To assemble the mounting bracket assembly 24, as shown in FIG. 9, the shelf 28 is connected to the mounting bracket 26. The first and third engagement members 60 and 64 are disposed in the first and second recesses 66 and 68 in the first longitudinally extending support member 48A. The shelf 28 is disposed on an upper surface 70B of the base portion 70 of the second longitudinally extending support member 48B, such that the second engagement member 62 is disposed in the opening 70A in the base portion 70. The shelf 28 is then slid in the forward direction, as shown in FIG. 9, such that the first and third engagement members 60 and 64 engage the ends of the recesses 66 and 68 and the second engagement member 62 engages the forward edge of the opening 70A, thereby preventing further forward movement of the shelf 28 with respect to the mounting bracket 26.

The electronic control module 16 can then be connected to the shelf 28, as shown in FIG. 9. A clip 72 disposed on a lower surface 16A of the electronic control module 16 is received by the first opening 56 in the shelf 28, thereby securing the electronic control module 16 to the shelf 28 and preventing forward movement of the electronic control module 16 with respect to the shelf 28. The engagement of the first and second engagement members 60 and 62 with the first and second longitudinally extending support members 48A and 48B prevent movement of the shelf 28 with respect to the mounting bracket 26 such that the mounting bracket assembly 24 can be disposed in a vertical orientation (a position rotated 180 degrees from the position shown in FIG. 9) to facilitate installation of the mounting bracket assembly 24. An installer can carry and manipulate the mounting bracket assembly 24, with the electronic control module 16 attached, in a vertical orientation prior to mounting the mounting bracket 26 to the display screen 14 without separation of the shelf 28, the mounting bracket 26 and the electronic control module 16. The mounting bracket assembly 24 provides a temporary installation position of the electronic control module 16 to facilitate installation.

The display screen attachment part 44 of the mounting bracket 26 is then connected to the display screen 18. The fastener holes 54A in the wall member 54 of the shelf 28 are aligned with fastener holes 74 in the first longitudinally extending support member 48A, as shown in FIGS. 3, 4 and 8. Fasteners 76 can then further secure the shelf 28 to the mounting bracket 26 to complete installation of the mounting bracket assembly 24. The mounting bracket 26 is configured to be mounted to the display screen 18 with the shelf 28 disposed in a horizontal orientation, as shown in FIG. 2-8. The mounting bracket 26 and the media chassis support structure 32 can then be secured together as described above.

General Interpretation of Terms

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts. Also as used herein to describe the above embodiment(s), the following directional terms "forward", "rearward", "above", "downward", "vertical", "horizontal", "below" and "transverse" as well as any other similar directional terms refer to those directions of a vehicle equipped with the mounting bracket assembly for an in-module media assembly. Accordingly, these terms, as utilized to describe the present invention should be interpreted relative to a vehicle equipped with the mounting bracket assembly for the in-module media assembly.

The terms of degree such as "substantially", "about" and "approximately" as used herein mean a reasonable amount of deviation of the modified term such that the end result is not significantly changed.

While only selected embodiments have been chosen to illustrate the present invention, it will be apparent to those skilled in the art from this disclosure that various changes and modifications can be made herein without departing from the scope of the invention as defined in the appended claims. For example, the size, shape, location or orientation of the various components can be changed as needed and/or desired. Components that are shown directly connected or contacting each other can have intermediate structures disposed between them. The functions of one element can be performed by two, and vice versa. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such feature(s). Thus, the foregoing descriptions of the embodiments according to the present invention are provided for illustration only, and not for the purpose of limiting the invention as defined by the appended claims and their equivalents.

What is claimed is:

1. An in-module media assembly comprising:
   a display screen having an interior-facing side and a non-interior facing side;
   a mounting bracket assembly mounted to the non-interior facing side of the display screen, the mounting bracket assembly including
      a mounting bracket having a first longitudinally extending support member and a second longitudinally extending support member; and
      a shelf connected to the first and second longitudinally extending support members, the shelf includes first second and third engagement members, the first engagement member engaging the first longitudinally extending support member, the second engagement member engaging the second longitudinally extending support member, and the third engagement member engaging the first longitudinally extending support member, the engagement between the first, second and third engagement members and the first and second longitudinally extending support members preventing forward movement of the shelf with respect to the mounting bracket;
   the shelf further including a base member and a wall member extending outwardly from a lateral edge of the base member, the base member and the wall member being substantially planar, the first and third engagement members extending from the wall member of the shelf, the second engagement member extending from the base member of the shelf,
   each of the engagements between the first, second and third engagement members and the first and second longitudinally extending support members being at a different height relative to the base member of the shelf; and
   an electronic control module mounted to the shelf.

2. The in-module media assembly according to claim 1, wherein the electronic control module is a telematics control unit.

3. The in-module media assembly according to claim 1, wherein
   the first longitudinally extending support member includes first and second recesses disposed therein, the first and third engagement members engaging the first and second recesses.

4. The in-module media assembly according to claim 3, wherein
   the second longitudinally extending support member includes a base portion extending toward the first longitudinally extending support member.

5. The in-module media assembly according to claim 4, wherein
   an opening is disposed in the base portion, the second engaging member of the shelf engaging the opening in the base portion.

6. The in-module media assembly according to claim 3, wherein
a first end portion of the first engagement member extends substantially parallel to the wall member.

7. The in-module media assembly according to claim 4, wherein
a second end portion of the second engagement member extends substantially parallel to the wall member.

8. The in-module media assembly according to claim 3, wherein
a third end portion of the third engagement member extends substantially perpendicular to the wall member.

9. The in-module media assembly according to claim 1, wherein
the base member includes an opening, and the electronic control module includes a clip received by the opening in the base member.

10. The in-module media assembly according to claim 1, wherein
a chassis support structure is connected to the mounting bracket, and a media chassis is received by the chassis support structure.

11. The in-module media assembly according to claim 10, wherein
a first contact section extends from a lower edge of the first longitudinally extending support member, and a second contact section extends from a lower edge of the second longitudinally extending support member.

12. The in-module media assembly according to claim 11, wherein
the first contact section extends along a majority of the lower edge of the first longitudinally extending support member, and the second contact section extends along a majority of the lower edge of the second longitudinally extending support member.

13. The in-module media assembly according to claim 11, wherein
lower surfaces of the first and second contact sections are spaced a predetermined distance from an upper surface of the media chassis.

14. The in-module media assembly according to claim 13, wherein
the predetermined distance is configured to decrease upon movement of the display screen toward the media chassis.

15. A mounting bracket assembly comprising:
a mounting bracket configured to be mounted to a display screen of a vehicle, the mounting bracket including a first longitudinally extending support member and a second longitudinally extending support member; and
a shelf connected to the first and second longitudinally extending support members, the shelf includes first, second and third engagement members, the first engagement member engaging the first longitudinally extending support member the second engagement member engaging the second longitudinally extending support member, and the third engagement member engaging the first longitudinally extending support member, the engagement between the first, second and third engagement members and the first and second longitudinally extending support members preventing forward movement of the shelf with respect to the mounting bracket,
the shelf further including a base member and a wall member extending outwardly from a lateral edge of the base member, the base member and the wall member being substantially planar, the first and third engagement members extending from the wall member of the shelf, the second engagement member extending from the base member of the shelf,
each of the engagements between the first, second and third engagement members and the first and second longitudinally extending support members being at a different height relative to the base member of the shelf.

16. The mounting bracket assembly according to claim 15, wherein
the mounting bracket is configured to be mounted to the display screen with the shelf disposed in a horizontal orientation.

17. The mounting bracket assembly according to claim 16, wherein
the first and second engagement members secure the shelf to the mounting bracket with the shelf disposed in a vertical orientation prior to mounting the mounting bracket to the display screen.

18. The mounting bracket assembly according to claim 15, wherein
first and second end portions of the first and second engagement members extend forwardly, and a third end portion of the third engagement member extends substantially laterally.

19. The mounting bracket assembly according to claim 10, wherein
a first contact section extends from a lower edge of the first longitudinally extending support member, and a second contact section extends from a lower edge of the second longitudinally extending support member.

20. The mounting bracket assembly according to claim 19, wherein
the first contact section extends along a majority of the lower edge of the first longitudinally extending support member, and the second contact section extends along a majority of the lower edge of the second longitudinally extending support member.

* * * * *